(12) United States Patent
Kato et al.

(10) Patent No.: US 10,636,803 B2
(45) Date of Patent: Apr. 28, 2020

(54) SEMICONDUCTOR MEMORY DEVICE WITH FLOATING GATES HAVING A CURVED LATERAL SURFACE

(71) Applicant: Toshiba Memory Corporation, Minato-ku (JP)

(72) Inventors: Tatsuya Kato, Yokkaichi (JP); Fumitaka Arai, Yokkaichi (JP); Kohei Sakaike, Yokkaichi (JP); Satoshi Nagashima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/704,667

(22) Filed: Sep. 14, 2017

(65) Prior Publication Data
US 2018/0269218 A1    Sep. 20, 2018

(30) Foreign Application Priority Data

Mar. 15, 2017  (JP) .................................. 2017-050087

(51) Int. Cl.
| | | |
|---|---|---|
| *H01L 27/11524* | (2017.01) | |
| *H01L 27/11556* | (2017.01) | |
| *H01L 27/11519* | (2017.01) | |
| *H01L 27/11573* | (2017.01) | |
| *H01L 27/11541* | (2017.01) | |
| *H01L 27/1156* | (2017.01) | |
| *H01L 27/1157* | (2017.01) | |

(52) U.S. Cl.
CPC .... *H01L 27/11524* (2013.01); *H01L 27/1156* (2013.01); *H01L 27/1157* (2013.01); *H01L 27/11519* (2013.01); *H01L 27/11541* (2013.01); *H01L 27/11556* (2013.01); *H01L 27/11573* (2013.01)

(58) Field of Classification Search
CPC ........... H01L 27/11524; H01L 27/1157; H01L 27/11551; H01L 27/11553; H01L 27/11556; H01L 27/11582; H01L 27/11519; H01L 27/11565
See application file for complete search history.

(56) References Cited

U.S. PATENT DOCUMENTS

| | | | |
|---|---|---|---|
| 7,906,804 B2 | 3/2011 | Akahori et al. | |
| 9,576,966 B1 * | 2/2017 | Peri ....................... | H01L 27/115 |
| 9,875,929 B1 * | 1/2018 | Shukla ................ | H01L 21/7682 |

(Continued)

FOREIGN PATENT DOCUMENTS

| | | |
|---|---|---|
| JP | 8-181231 | 7/1996 |
| JP | 2009-289813 | 12/2009 |

(Continued)

*Primary Examiner* — Marcos D. Pizarro
*Assistant Examiner* — Younes Boulghassoul
(74) *Attorney, Agent, or Firm* — Oblon, McClelland, Maier & Neustadt, L.L.P.

(57) ABSTRACT

A semiconductor memory device includes a semiconductor member extending in a first direction, a first interconnect extending in a second direction crossing the first direction, and a first electrode disposed between the semiconductor member and the first interconnect. A curvature radius of a corner portion facing the semiconductor member in the first electrode is larger than a curvature radius of a corner portion facing the first interconnect in the first electrode.

13 Claims, 13 Drawing Sheets

(56) References Cited

U.S. PATENT DOCUMENTS

| | | | |
|---|---|---|---|
| 2014/0203344 A1* | 7/2014 | Hopkins | H01L 29/42324 257/316 |
| 2015/0364485 A1* | 12/2015 | Shimura | H01L 27/11556 257/316 |
| 2016/0071861 A1* | 3/2016 | Serov | H01L 27/11556 365/185.19 |
| 2016/0293623 A1* | 10/2016 | Simsek-Ege | H01L 27/11582 |
| 2016/0343868 A1 | 11/2016 | Koezuka et al. | |
| 2017/0263615 A1* | 9/2017 | Sakaike | H01L 27/11519 |

FOREIGN PATENT DOCUMENTS

| | | |
|---|---|---|
| JP | 2012-44229 | 3/2012 |
| TW | 201705491 A | 2/2017 |

* cited by examiner

SEMICONDUCTOR MEMORY DEVICE WITH FLOATING GATES HAVING A CURVED LATERAL SURFACE

CROSS-REFERENCE TO RELATED APPLICATIONS

This application is based upon and claims the benefit of priority from Japanese Patent Application No. 2017-050087, filed on Mar. 15, 2017; the entire contents of which are incorporated herein by reference.

FIELD

Embodiments relate to a semiconductor memory device.

BACKGROUND

Conventionally, in a semiconductor memory device, a capacity was tried to be increased by miniaturizing a circuit. However, a miniaturization technique is reaching its limit, and therefore, in order to further increase the capacity, a stacked-type semiconductor memory device has been proposed. In a stacked-type semiconductor memory device, a plurality of interconnects extending in a horizontal direction and a plurality of semiconductor members extending in a vertical direction are provided on a substrate, and a charge storage member is provided between the interconnect and the semiconductor member. Thereby, a memory cell transistor is formed at each crossing portion between the interconnect and the semiconductor member. In such a semiconductor memory device, a problem is to ensure reliability.

BRIEF DESCRIPTION OF THE DRAWINGS

FIGS. 5A and 5B to FIGS. 12A and 12B are sectional views showing a method for manufacturing the semiconductor memory device according to the embodiment.

DETAILED DESCRIPTION

A semiconductor memory device according to an embodiment, includes a semiconductor member extending in a first direction, a first interconnect extending in a second direction crossing the first direction, and a first electrode disposed between the semiconductor member and the first interconnect. A curvature radius of a corner portion facing the semiconductor member in the first electrode is larger than a curvature radius of a corner portion facing the first interconnect in the first electrode.

Embodiments

Hereinafter, embodiments of the invention will be described.

Figure 1:
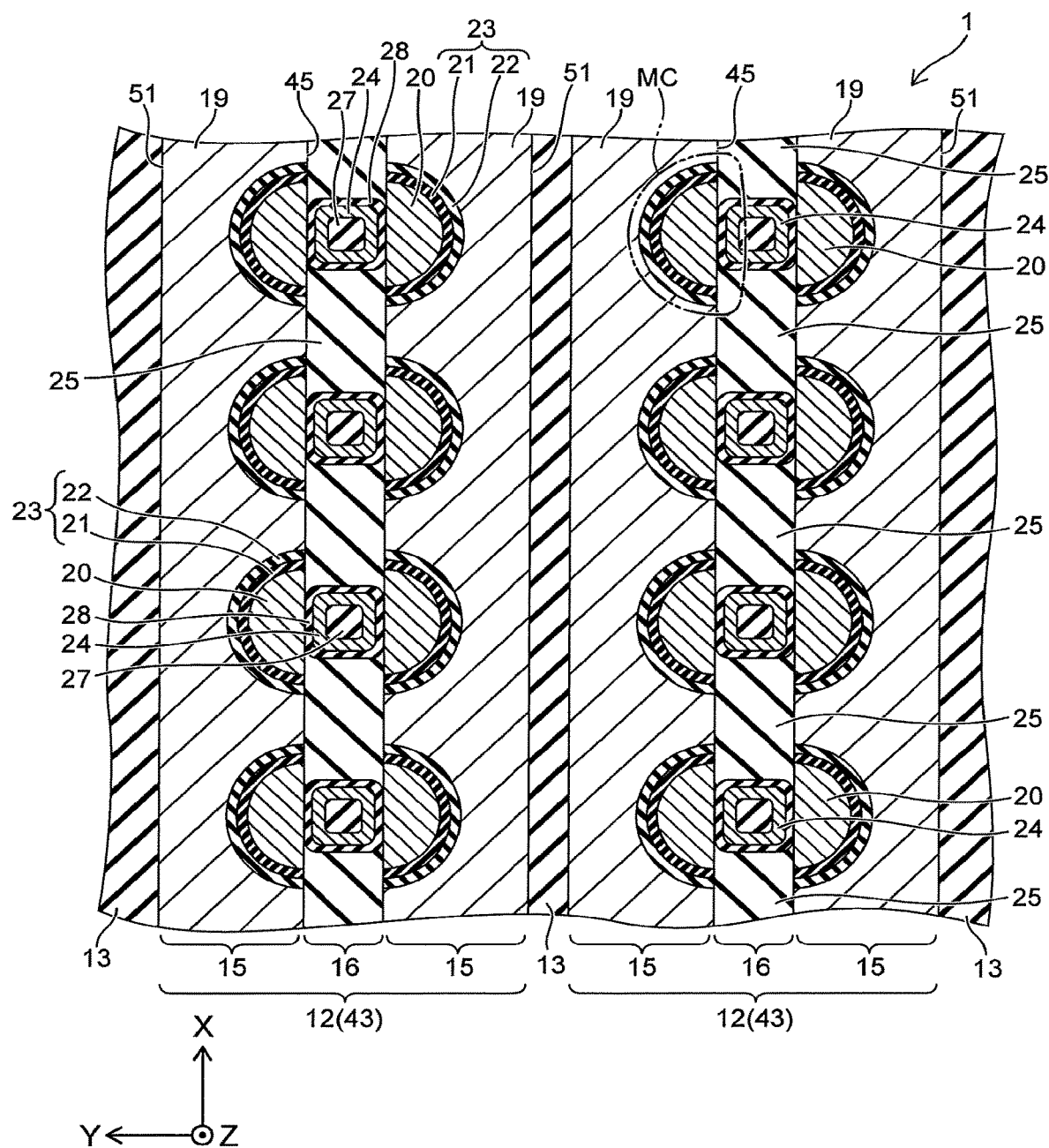
FIG. 1 is a sectional view showing a semiconductor memory device according to an embodiment.

FIG. 1 is a sectional view showing a semiconductor memory device according to the embodiment.

Figure 2:
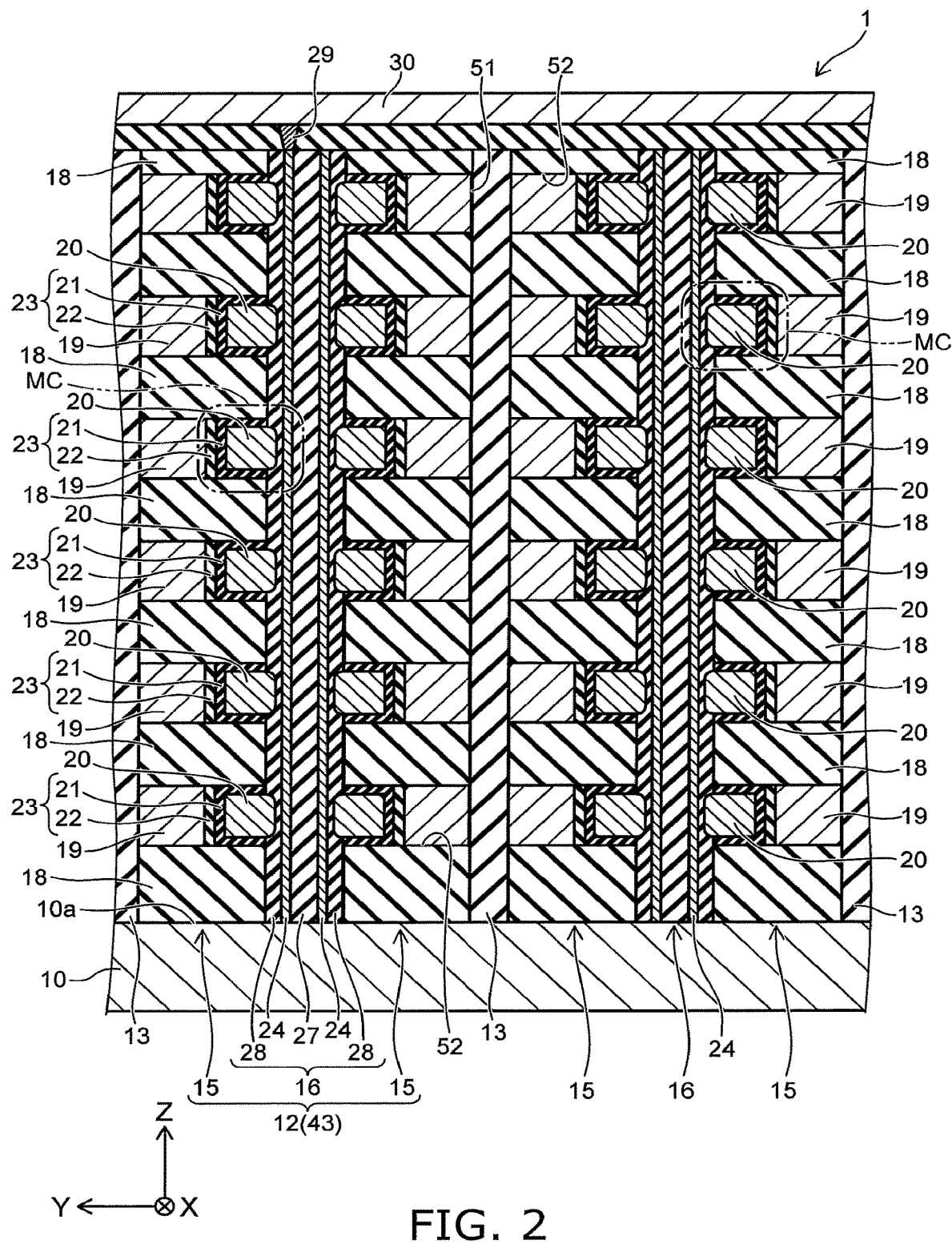
FIG. 2 is a sectional view showing the semiconductor memory device according to the embodiment.

FIG. 2 is a sectional view showing the semiconductor memory device according to the embodiment, and shows a section orthogonal to FIG. 1.

Figure 3A:
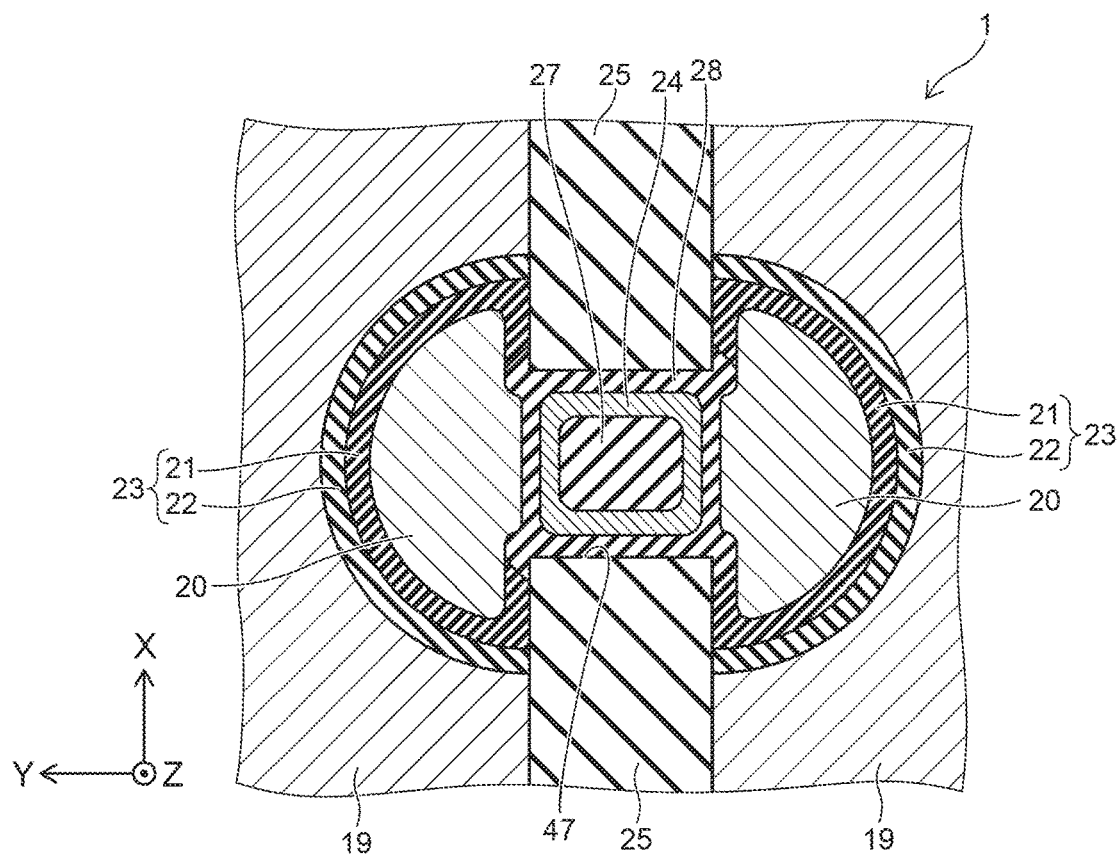
FIGS. 3A and 3B are sectional views showing the semiconductor memory device according to the embodiment.
Figure 3B:
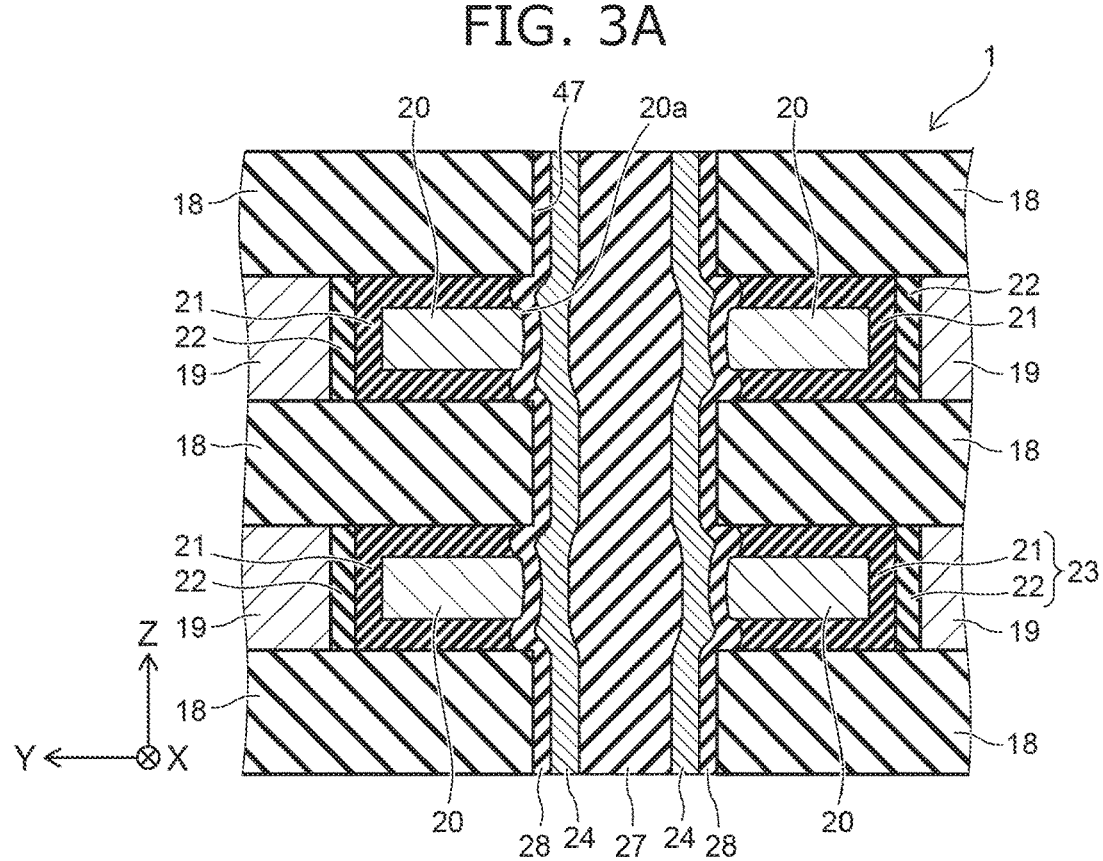

FIGS. 3A and 3B are sectional views showing the semiconductor memory device according to the embodiment, and FIG. 3A is an enlarged view of FIG. 1, and FIG. 3B is an enlarged view of FIG. 2.

Figure 4:
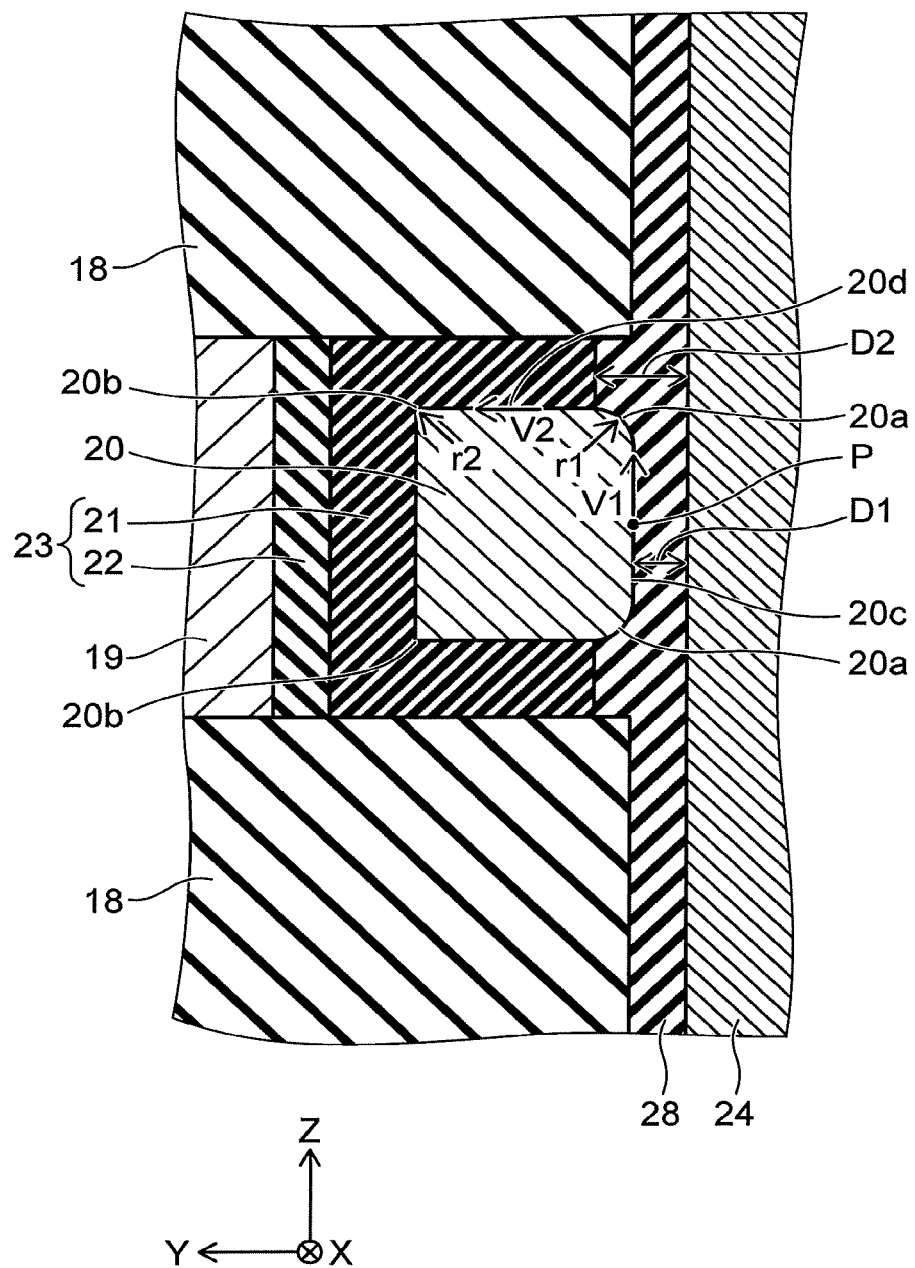
FIG. 4 is a sectional view showing one memory cell of the semiconductor memory device according to the embodiment.

FIG. 4 is a sectional view showing one memory cell of the semiconductor memory device according to the embodiment, and is an enlarged view of FIG. 3B.

Incidentally, the respective drawings are schematic views and are drawn in an exaggerated and simplified form as appropriate. For example, each constituent element is drawn such that the number of elements is less than the actual number and the size thereof is larger than the actual size. Further, the dimensional ratios of constituent elements are not necessarily the same among the drawings.

The semiconductor memory device according to the embodiment is a stacked-type NAND flash memory.

As shown in FIGS. 1 and 2, in a semiconductor memory device 1 (hereinafter also simply referred to as "device 1") according to the embodiment, a silicon substrate 10 is provided. The silicon substrate 10 is formed of, for example, a silicon single crystal. Incidentally, a polysilicon film may be used in place of the silicon substrate 10.

Hereinafter, in the specification, for the sake of convenience of description, an XYZ orthogonal coordinate system is adopted. Two directions parallel to an upper surface 10a of the silicon substrate 10 and also orthogonal to each other are referred to as "X-direction" and "Y-direction", and a direction perpendicular to the upper surface 10a of the silicon substrate 10 is referred to as "Z-direction". Further, in the Z-direction, one direction is also referred to as "upper", and a direction opposite thereto is also referred to as "lower". However, also these terms are for reference only, and are irrelevant to the direction of gravity.

On the silicon substrate 10, a plurality of stacked bodies 12 and a plurality of insulating plates 13 are provided and arranged alternately along the Y-direction. A longitudinal direction of the stacked body 12 is the X-direction. The insulating plate 13 is composed of, for example, silicon oxide, and a shape thereof is a plate shape spreading along an X-Z plane.

In the stacked body 12, two word line stacked bodies 15 are provided. The two word line stacked bodies 15 are spaced from each other in the Y-direction. Between the two word line stacked bodies 15, one pillar stacked body 16 is provided.

In each word line stacked body 15, a silicon oxide film 18 and a word line 19 are alternately stacked along the Z-direction. The word line 19 is formed of, for example, a conductive material such as tungsten (W). In the specification, the "silicon oxide film" refers to a film containing silicon oxide (SiO) as a main component, and contains silicon (Si) and oxygen (O). The same applies to other constituent elements, and in the case where the name of a constituent element includes the name of a material, the main component of the constituent element is the material. Further, silicon oxide is generally an insulating material, and therefore, unless otherwise specifically described, the silicon oxide film is an insulating film. The same applies to other members, and in principle, the property of the member reflects the property of the main component.

A floating gate electrode 20 is provided between the silicon oxide films 18 adjacent to each other in the Z-direction and between the word line 19 and the pillar stacked body 16. The floating gate electrode 20 is formed of, for example, a conductive material such as polysilicon. A shape of the floating gate electrode 20 is substantially a semicircular plate shape or a semi-circular ring shape. On an upper surface, on a lower surface, and on a side surface facing the word line 19 of the floating gate electrode 20, a silicon nitride film 21 is provided. Between the silicon nitride film 21 and the word line 19, a silicon oxide film 22 is provided. By the silicon nitride film 21 and the silicon oxide film 22, a block insulating film 23 is formed. The block insulating film 23 is a film through which a current does not substantially flow even if a voltage within a drive voltage range of the device 1 is applied thereto.

In the pillar stacked body 16, a silicon pillar 24 and an insulating member 25 are alternately arranged along the X-direction. The silicon pillar 24 is a semiconductor member, and is disposed between the floating gate electrodes 20 adjacent to each other in the Y-direction. A shape of the silicon pillar 24 is a cylindrical shape extending in the Z-direction, and a shape of an X-Y section thereof is substantially a quadrangle, a quadrangle with rounded corners, a circle, or an elongated circle whose long diameter direction is the Y-direction. A lower end of the silicon pillar 24 may be closed. The lower end of the silicon pillar 24 is connected to the silicon substrate 10. The silicon substrate 10 functions as a source line.

In the silicon pillar 24, a core member 27 composed of, for example, silicon oxide is provided. On a side surface of the silicon pillar 24, a tunneling insulating film 28 is formed. The tunneling insulating film 28 is a film which usually has an insulating property, but allows a tunneling current to flow therethrough when a given voltage within a drive voltage range of the device 1 is applied thereto, and is composed of, for example, silicon oxide.

The word line 19 is not disposed between a pair of floating gate electrodes 20 adjacent to each other in the Y-direction and interposing one silicon pillar 24 therebetween. On the other hand, a part of the word line 19 is disposed between the floating gate electrodes 20 adjacent to each other in the X-direction. Further, the silicon oxide film 18 is disposed between the floating gate electrodes 20 adjacent to each other in the Z-direction. Between the silicon pillars 24 adjacent to each other in the X-direction, the tunneling insulating film 28 and the insulating member 25 are disposed, but the floating gate electrode 20 and the word line 19 are not disposed.

On the silicon pillar 24, a plug 29 is provided. On the plug 29, a bit line 30 extending in the Y-direction is provided. An upper end of the silicon pillar 24 is connected to the bit line 30 through the plug 29. Then, at each crossing portion between the silicon pillar 24 and the word line 19, a memory cell transistor MC is formed through the tunneling insulating film 28, the floating gate electrode 20, and the block insulating film 23. According to this, a plurality of memory cell transistors MC is directly connected between the silicon substrate 10 and the bit line 30, whereby an NAND string is formed. The memory cell transistor MC stores data by changing a threshold value according to an amount of charge stored in the floating gate electrode 20.

As shown in FIGS. 3A and 3B, and FIG. 4, a distance D1 between the silicon pillar 24 and the floating gate electrode 20 is shorter than a distance D2 between the silicon pillar 24 and the silicon nitride film 21. That is, D1<D2.

In a Y-Z plane shown in FIG. 4, a side surface 20c facing the silicon pillar 24 in the floating gate electrode 20 is curved in a convex shape as a whole. Therefore, a portion closest to the silicon pillar 24 in the floating gate electrode 20 is a central portion in the Z-direction of the side surface 20c. Incidentally, the central portion of the side surface 20c may be flat.

Further, a corner portion 20a facing the silicon pillar 24 in the floating gate electrode 20 is gently rounded, and a curvature radius r1 of the corner portion 20a is larger than a curvature radius r2 of a corner portion 20b facing the word line 19 in the floating gate electrode 20. That is, r1>r2.

Further, when a virtual point P which moves on a surface of the floating gate electrode 20 moves from a central portion of the side surface 20c facing the silicon pillar 24 in the floating gate electrode 20 to a central portion of the upper surface 20d of the floating gate electrode 20 through the corner portion 20a in a shortest path, the moving direction of the point P monotonously changes from a direction V1 directed upward to a direction V2 directed from the corner portion 20a to the corner portion 20b in the X-direction. That is, the moving direction of the point P irreversibly changes from the direction V1 to the direction V2 and does not return on the way.

Further, the floating gate electrode 20 is disposed inside a space surrounded by a contact surface of a central portion of the side surface 20c facing the silicon pillar 24 in the floating gate electrode 20, that is, a plane including the direction V1, a contact surface of a central portion of the upper surface 20d of the floating gate electrode 20, that is, a plane including the direction V2, and a contact surface of a central portion of the lower surface of the floating gate electrode 20, and does not protrude outside this space. The surface of the floating gate electrode 20 is inclined away from the silicon pillar 24 toward the central portion of the upper surface 20d from the central portion of the side surface 20c.

Subsequently, an operation of the semiconductor memory device according to the embodiment will be described.

As shown in FIG. 2, when data is written into the memory cell transistor MC, for example, a ground potential is applied to the silicon pillar 24 through the selected bit line 30 and the plug 29, and a positive writing potential is applied to the selected word line 19, whereby electrons are injected into the floating gate electrode 20 from the silicon pillar 24 through the tunneling insulating film 28. By doing this, the threshold value of the selected memory cell transistor MC is changed, and data is written.

When data written into the memory cell transistor MC is read, an on potential is applied to the non-selected word line 19 so that the memory cell transistor MC is brought into a conductive state, a reading potential is applied to the selected word line 19, and a current flowing through the silicon pillar 24 is measured, whereby the threshold value of the selected memory cell transistor MC is determined.

When data written into the memory cell transistor MC is erased, a positive erasing potential is applied to the silicon pillar 24 through the selected bit line 30, and for example, a ground potential is applied to the selected word line 19, whereby electrons stored in the floating gate electrode 20 are discharged to the silicon pillar 24 through the tunneling insulating film 28. By doing this, the threshold value of the selected memory cell transistor MC is returned to the original value. In this manner, in a writing operation and an erasing operation, a tunneling current flows through the tunneling insulating film 28.

Next, a method for manufacturing the semiconductor memory device according to the embodiment will be described.

FIGS. 5A and 5B to FIGS. 12A and 12B are sectional views showing a method for manufacturing the semiconductor memory device according to the embodiment.

Figure 5A:
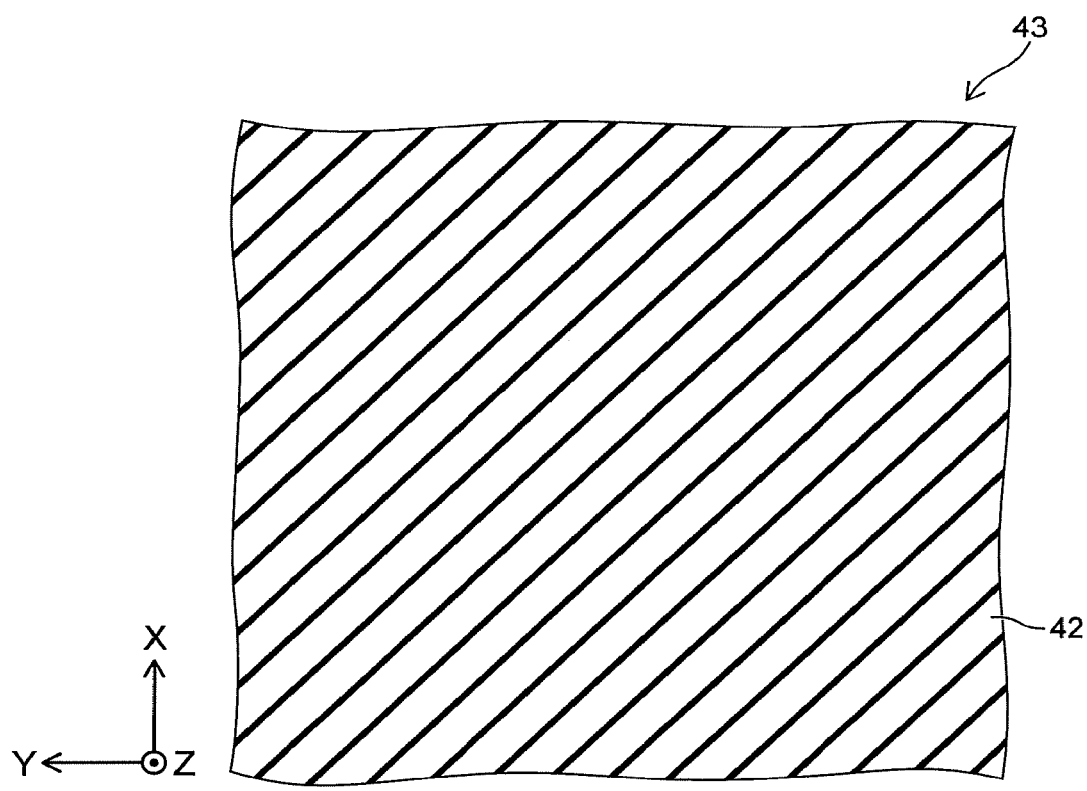
Figure 5B:
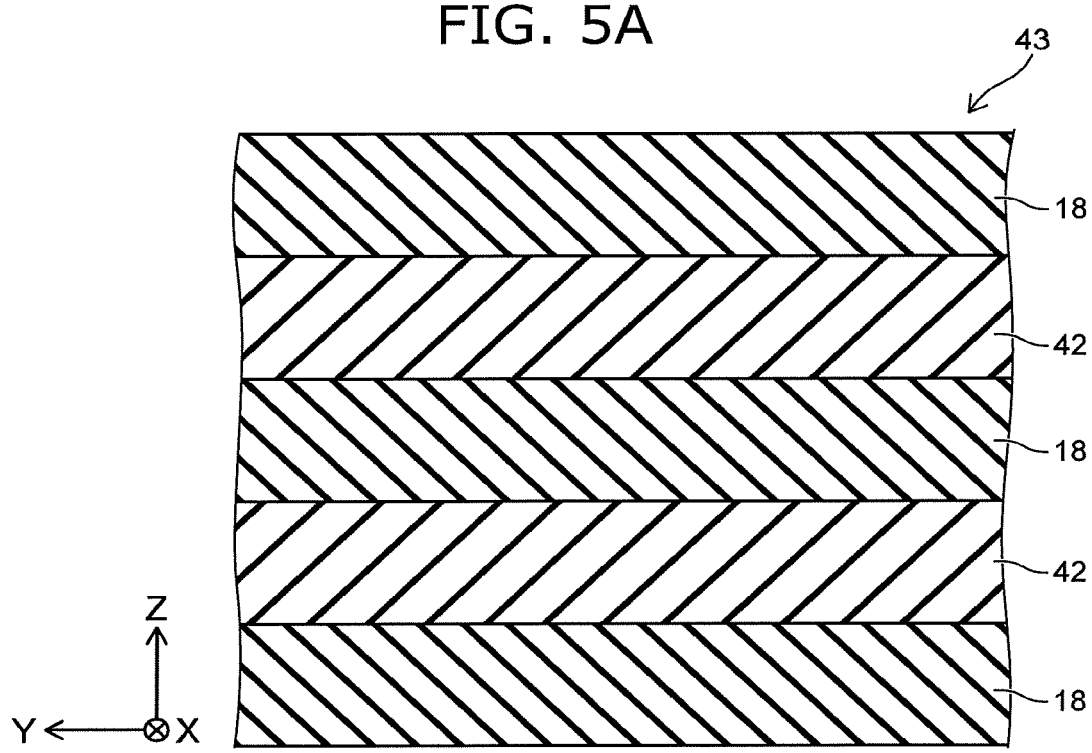

FIGS. 5A and 5B show mutually different sections of the same intermediate structure body. The same applies to FIGS. 6A and 6B to FIGS. 12A and 12B.

First, as shown in FIGS. 5A and 5B, a stacked body 43 is formed by alternately stacking the silicon oxide film 18 and a silicon nitride film 42 on the silicon substrate 10 (see FIG. 2).

Figure 6A:
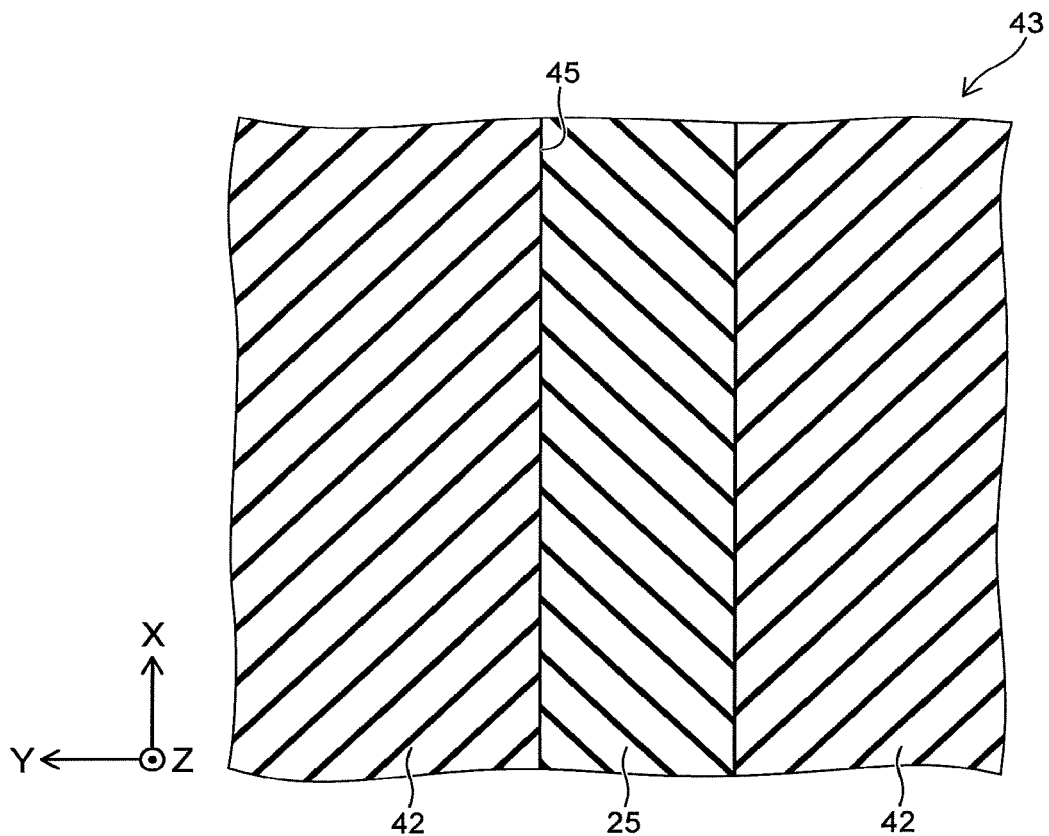
Figure 6B:
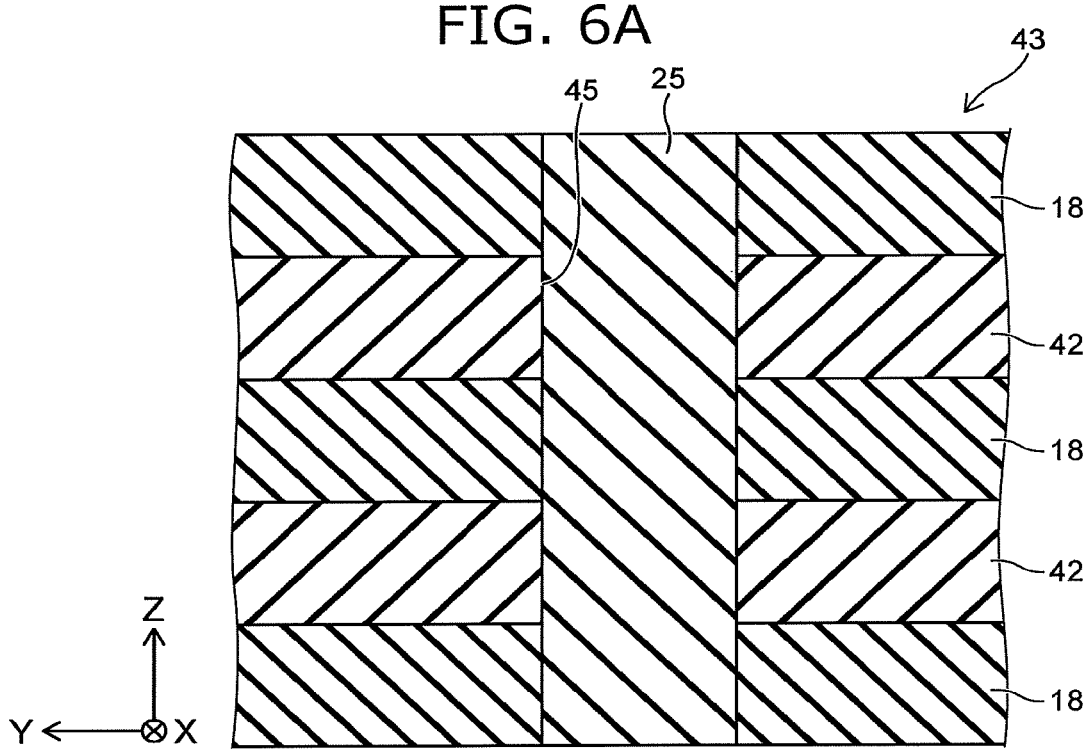

Subsequently, as shown in FIGS. 6A and 6B, in the stacked body 43, a plurality of memory trenches 45 extending in the X-direction is formed. The memory trenches 45 are periodically arranged along the Y-direction. Incidentally, in FIGS. 6A and 6B, only one memory trench 45 is shown. The memory trench 45 pierces the stacked body 43 in the Z-direction. Subsequently, the insulating member 25 is formed in the memory trench 45 by depositing silicon oxide.

Figure 7A:
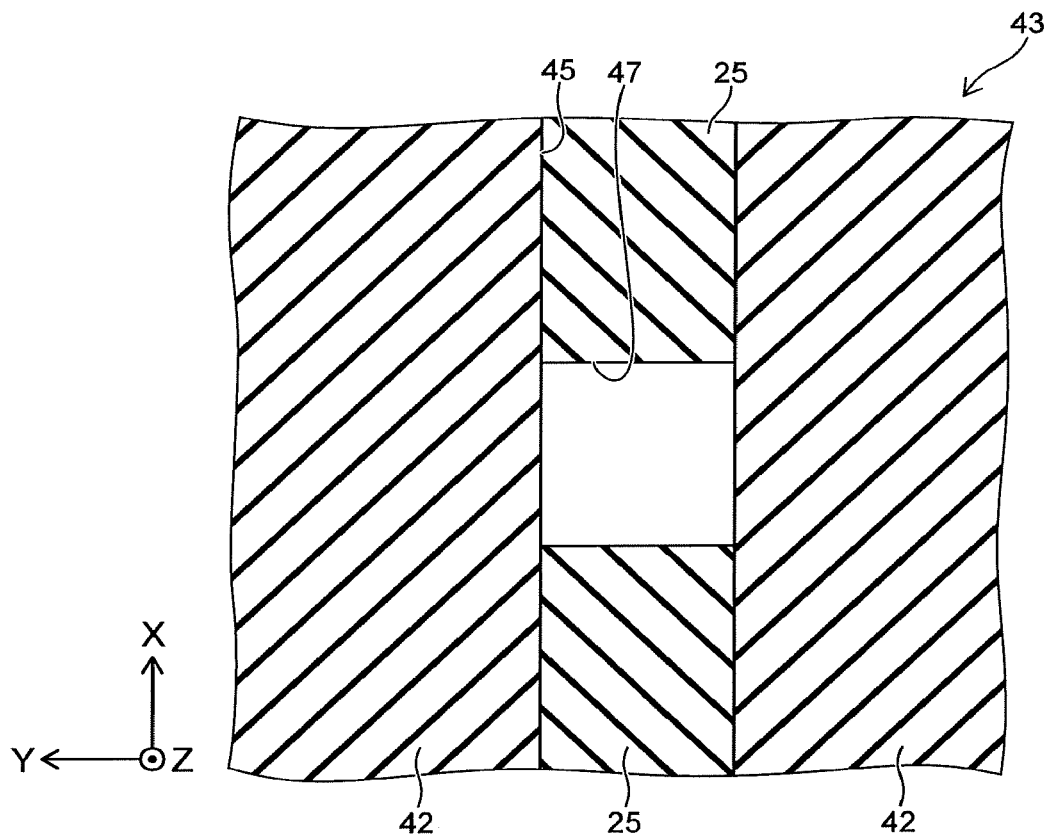
Figure 7B:
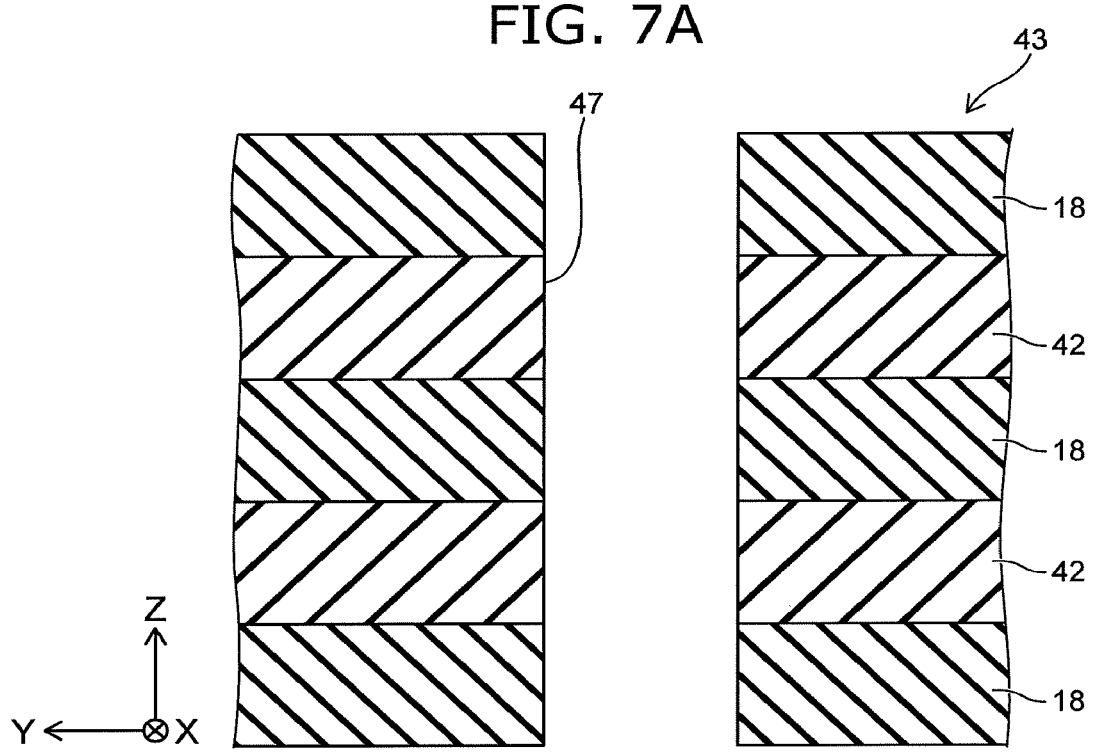

Subsequently, as shown in FIGS. 7A and 7B, in the insulating member 25, a memory hole 47 is formed. At this time, in each insulating member 25, a plurality of memory holes 47 is periodically arranged along the X-direction. The memory hole 47 divides the insulating member 25 in the X-direction, and on a side surface of the memory hole 47, the silicon oxide film 18 and the silicon nitride film 42 are exposed. Further, on a bottom surface of the memory hole 47, the silicon substrate 10 (see FIG. 2) is exposed. Incidentally, the memory hole 47 may be formed so as to extend in a portion sandwiching the insulating member 25 in the stacked body 43.

Figure 8A:
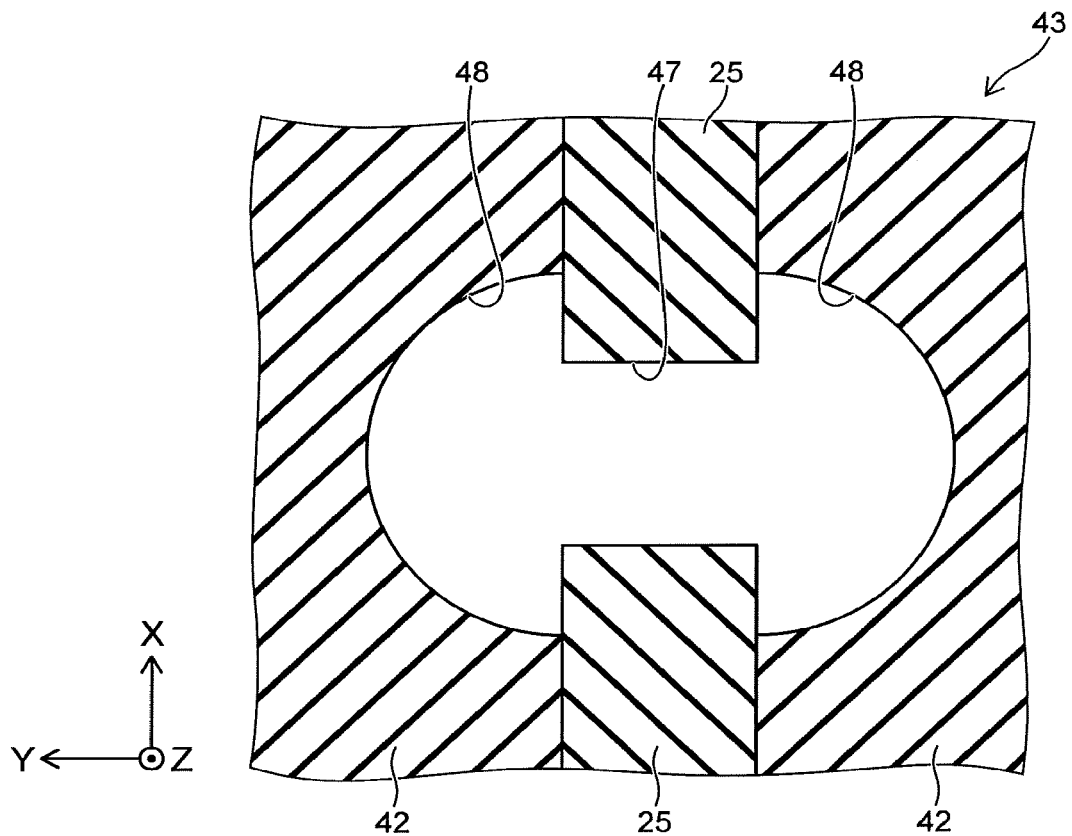
Figure 8B:
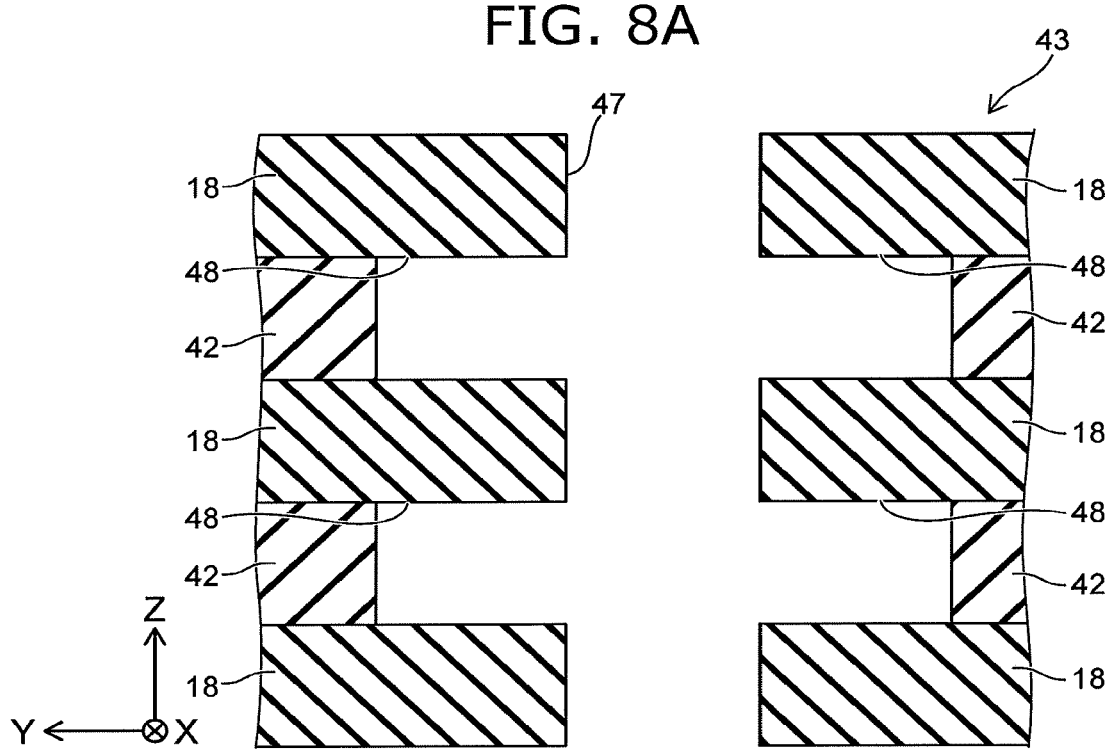

Subsequently, as shown in FIGS. 8A and 8B, the silicon nitride film 42 is recessed by performing isotropic etching of silicon nitride through the memory hole 47. As this isotropic etching, for example, wet etching using hot phosphoric acid is performed. As a result, a space 48 communicating with the memory hole 47 is formed in a portion between the silicon oxide films 18 adjacent to each other in the Z-direction.

Figure 9A:
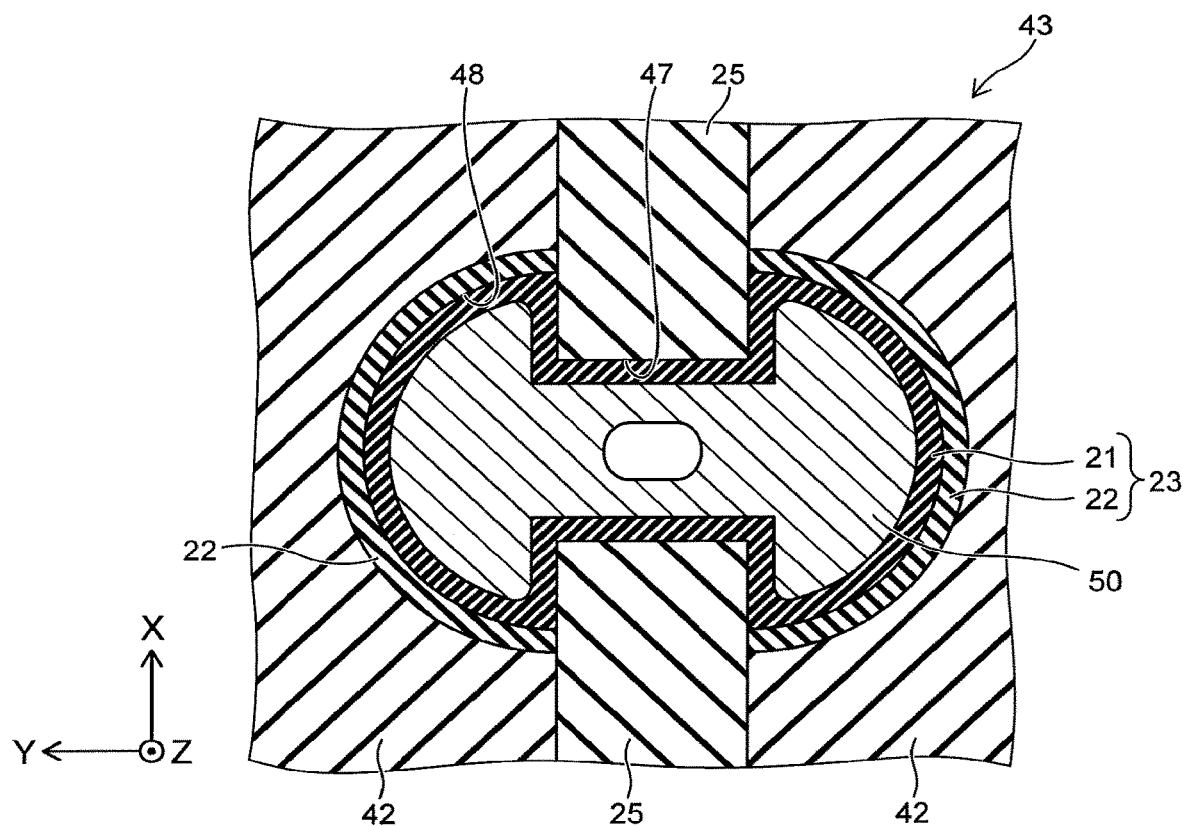
Figure 9B:
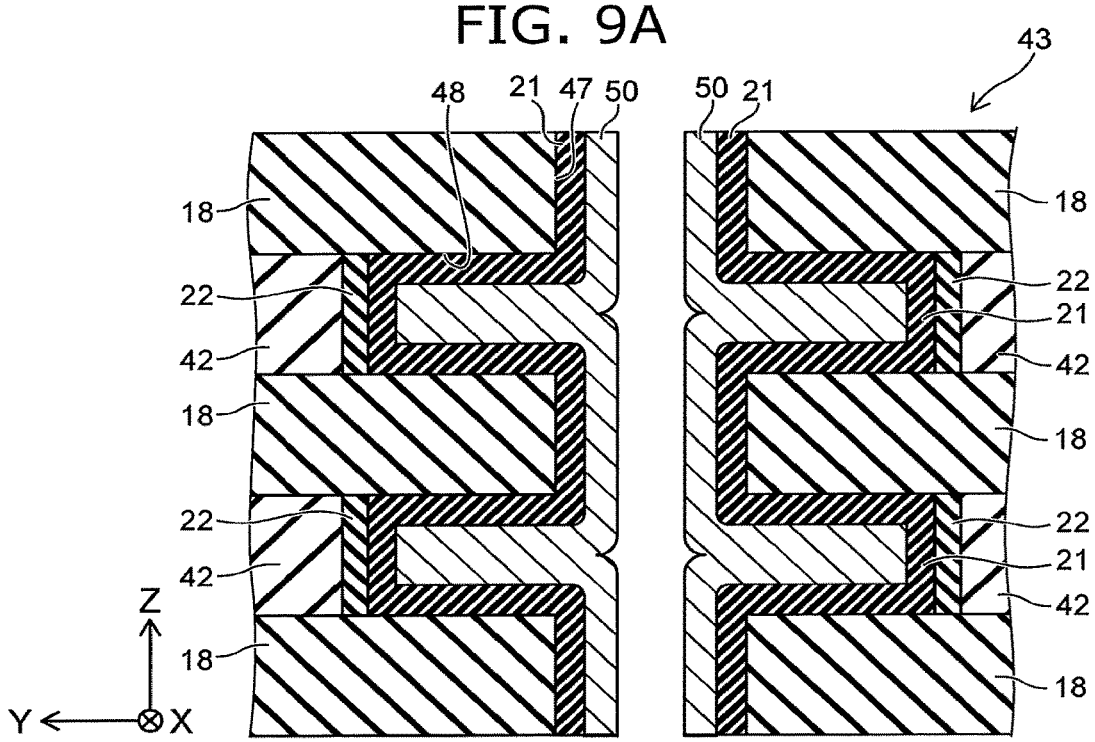

Subsequently, as shown in FIGS. 9A and 9B, an exposed portion of the silicon nitride film 42 is oxidized by performing a heat treatment in an oxidizing atmosphere. By doing this, the silicon oxide film 22 is formed on a back surface of the space 48. Incidentally, the silicon oxide film 22 may be formed by a deposition method. Subsequently, the silicon nitride film 21 is formed on an inner surface of the memory hole 47 and the space 48 by depositing silicon nitride. By the silicon oxide film 22 and the silicon nitride film 21, the block insulating film 23 is formed. The block insulating film 23 may be formed as a three-layer film in which a silicon oxide film, a silicon nitride film, and a silicon oxide film are stacked, and may include a film composed of hafnium silicon oxide (HfSiO).

Subsequently, a conductive polysilicon film 50 is formed on a surface of the silicon nitride film 21 by depositing silicon. A deposition amount of the polysilicon film 50 is adjusted so that the inside of the space 48 is completely filled, but the inside of the memory hole 47 is not completely filled.

Figure 10A:
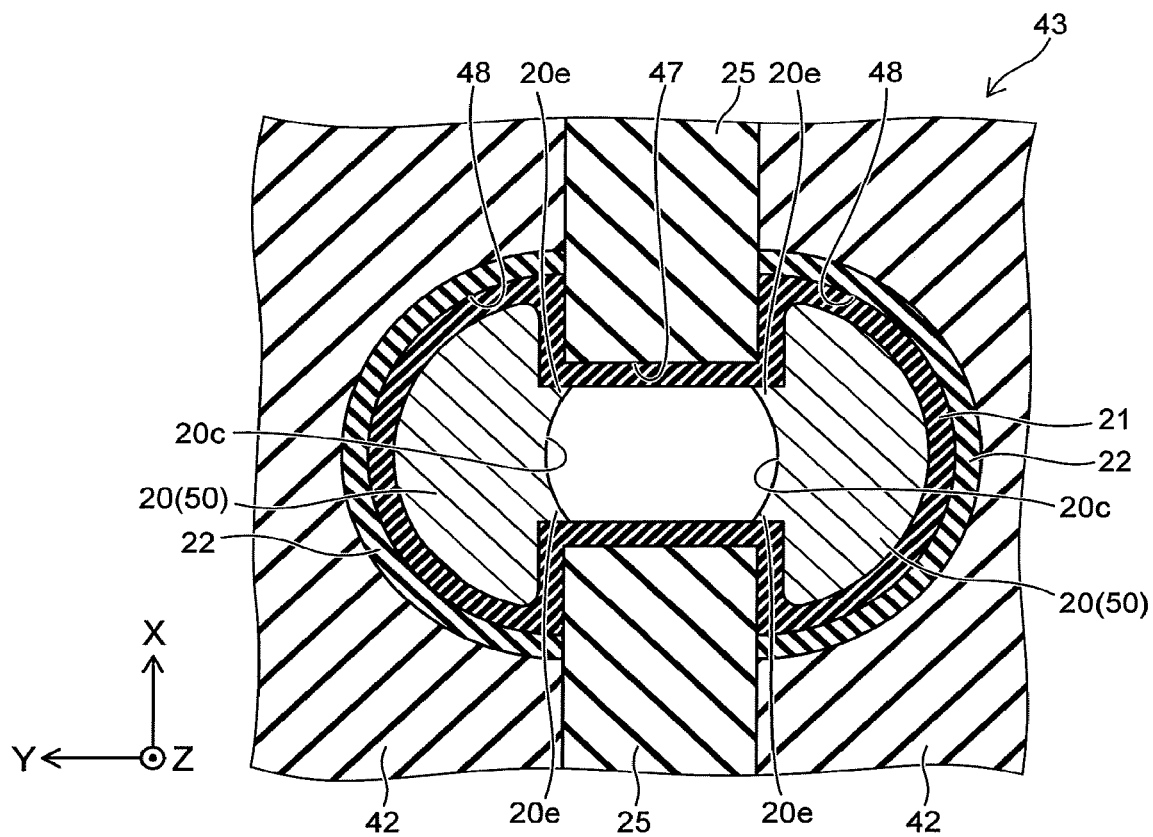
Figure 10B:
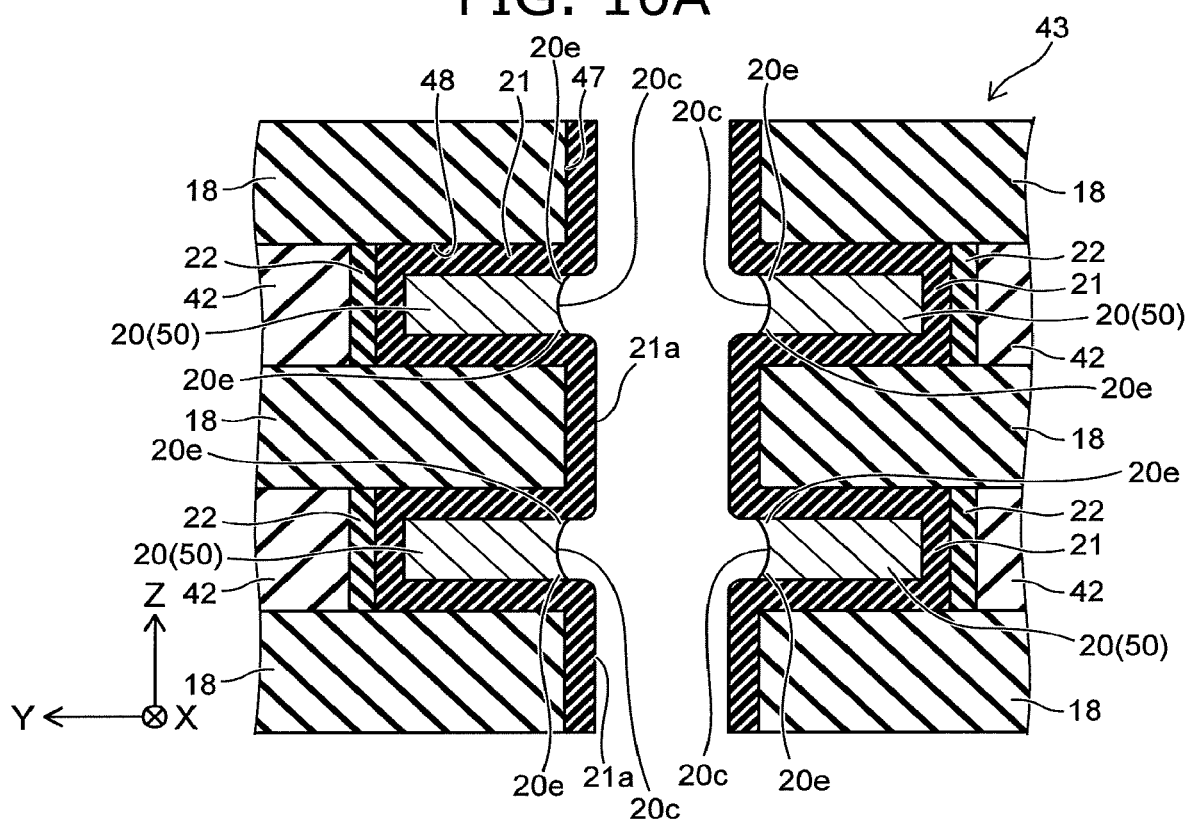

Subsequently, as shown in FIGS. 10A and 10B, the polysilicon film 50 is recessed by performing isotropic etching of silicon. As this isotropic etching, for example, wet etching using CDE (Chemical Dry Etching) or TMY (a choline aqueous solution) is performed. By doing this, the polysilicon film 50 is removed from the side surface of the insulating member 25, and therefore is divided on both sides in the Y-direction sandwiching the memory hole 47, and is also removed from the side surface of the silicon oxide film 18, and therefore is divided also in the Z-direction. As a result, the polysilicon film 50 is divided into a plurality of floating gate electrodes 20 disposed in the space 48.

At this time, the silicon nitride film 21 is hardly etched, and therefore, the side surface 20c of the floating gate electrode 20 exposed in the memory hole 47 is retreated more than the surface 21a of the silicon nitride film 21. Further, the progress of etching in a portion in contact with the silicon nitride film 21 in the floating gate electrode 20 is slower than in a portion spaced from the silicon nitride film 21. As a result, the shape of the side surface 20c becomes a concave shape in which the surface is retreated more as it is further away from the silicon nitride film 21, and a corner portion 20e with an acute angle is formed in a portion in contact with the silicon nitride film 21.

Figure 11A:
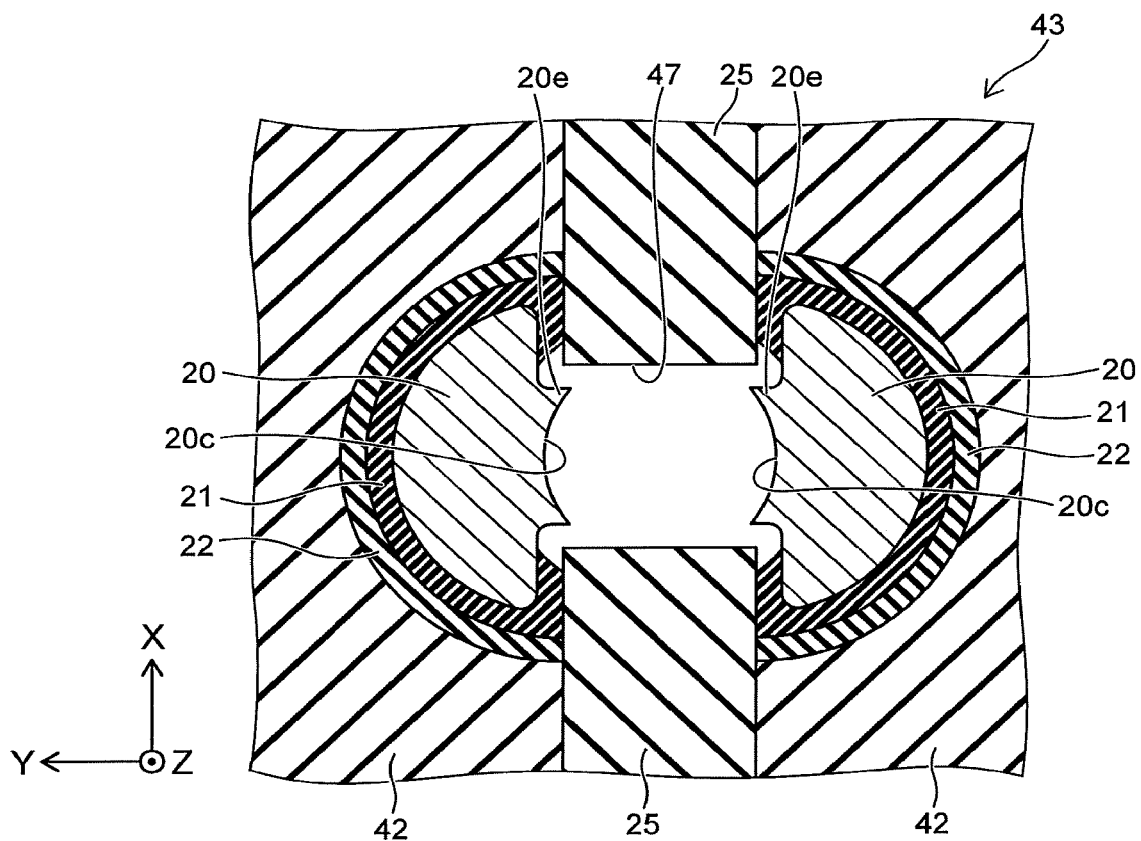
Figure 11B:
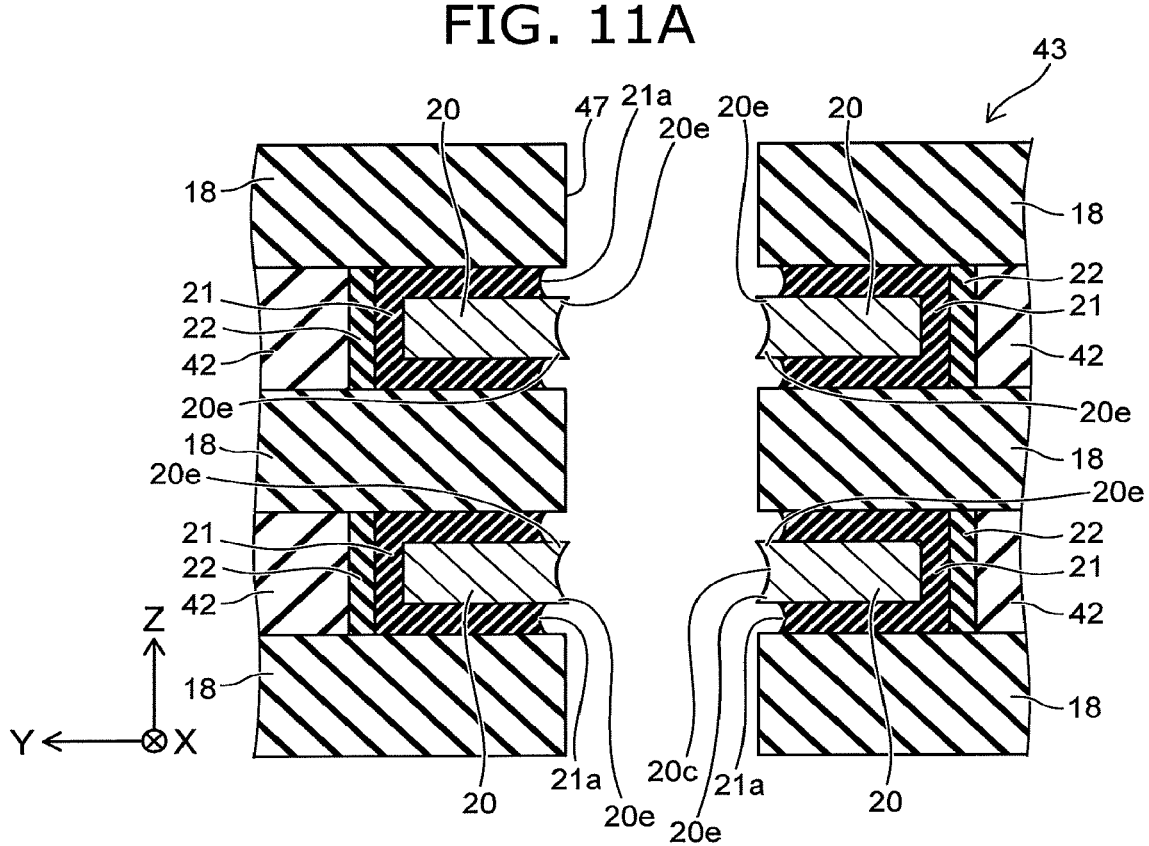

Subsequently, as shown in FIGS. 11A and 11B, an exposed portion of the silicon nitride film 21 is recessed by performing isotropic etching of silicon nitride through the memory hole 47. By doing this, the surface 21a of the silicon nitride film 21 is retreated more than the side surface 20c of the floating gate electrode 20, and a surface facing the Z-direction and a surface facing the X-direction in the surface of the corner portion 20e with an acute angle of the floating gate electrode 20 are exposed. As a result, the corner portion 20e protrudes in the memory hole 47.

Figure 12A:
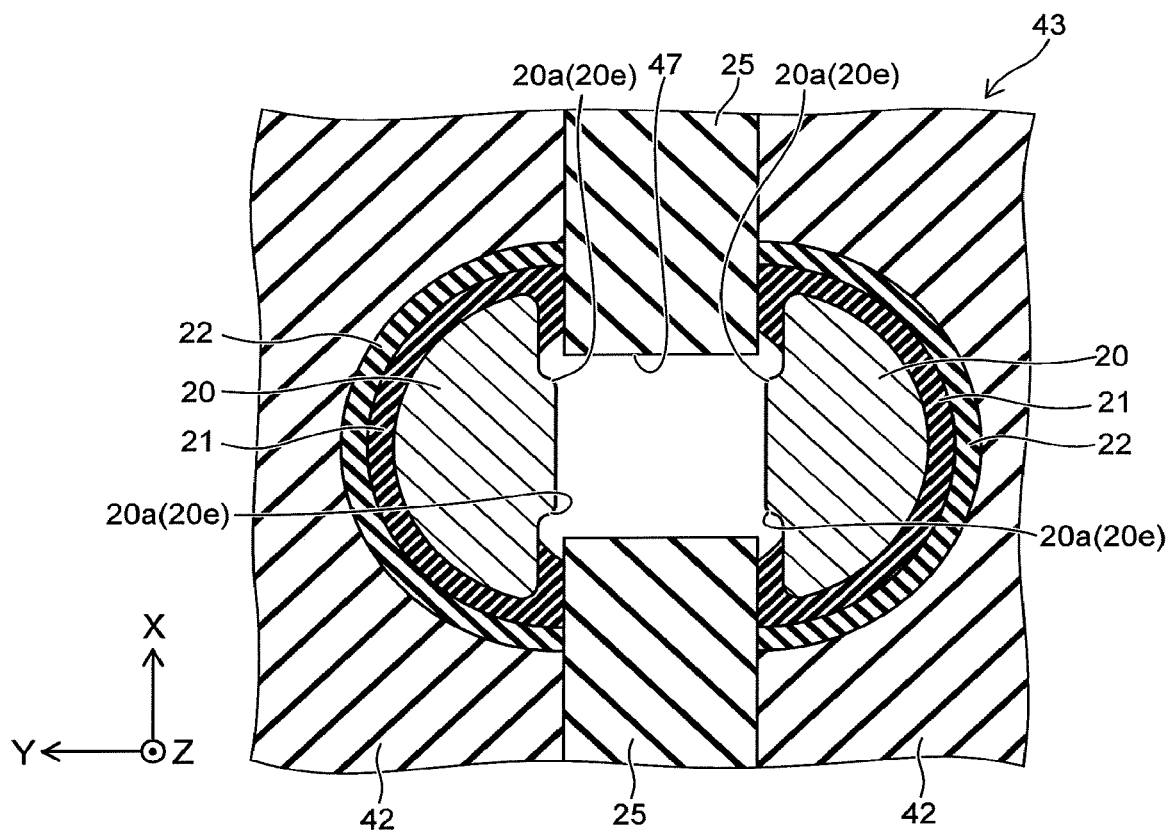
Figure 12B:
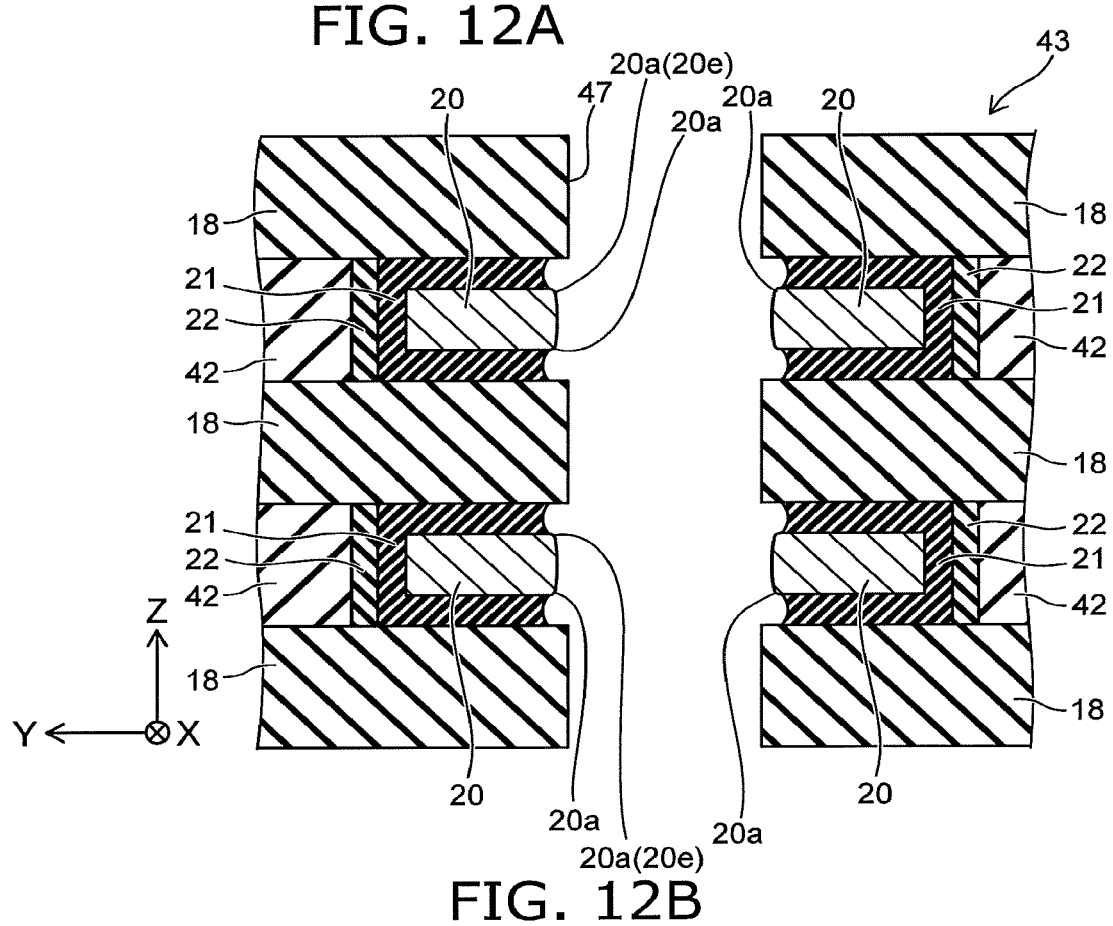

Subsequently, as shown in FIGS. 12A and 12B, isotropic etching of silicon is performed again. As this etching, also wet etching using CDE or TMY is performed. By doing this, the corner portion 20e with an acute angle of the floating gate electrode 20 is selectively etched, whereby the corner portion 20a which is gently rounded is formed.

Subsequently, as shown in FIGS. 3A and 3B, the tunneling insulating film 28 is formed on an inner surface of the memory hole 47 by depositing silicon oxide. The tunneling insulating film 28 covers the silicon nitride film 21 and the floating gate electrode 20. Subsequently, the silicon substrate 10 (see FIG. 2) is exposed by removing the tunneling insulating film 28 and the silicon oxide film 22 from the bottom surface of the memory hole 47. Subsequently, the silicon pillar 24 is formed on the side surface of the tunneling insulating film 28 by depositing silicon. The shape of the silicon pillar 24 is a cylindrical shape whose lower end is closed, and the lower end is connected to the silicon substrate 10. Subsequently, the core member 27 is formed in the memory hole 47 by depositing silicon oxide.

Subsequently, as shown in FIGS. 1 and 2, a slit 51 extending in the X-direction is formed between the memory trenches 45 in the stacked body 43. By the slit 51, the stacked body 43 is divided into a plurality of stacked bodies 12. Subsequently, the silicon nitride film 42 (see FIGS. 12A and 12B) is removed by, for example, performing wet etching using hot phosphoric acid through the slit 51. By doing this, a space 52 is formed between the silicon oxide films 18 adjacent to each other in the Z-direction. In this wet etching, the silicon oxide film 22 serves as a stopper, and the silicon oxide film 22 is exposed on the back surface of the space 52.

Subsequently, the word line 19 is formed in the space 52 by, for example, depositing tungsten, followed by removing tungsten from the inside of the slit 51. In this manner, the silicon nitride film 42 is replaced with the word line 19. Incidentally, before tungsten is deposited, an insulating material such as silicon oxide ($SiO_2$), aluminum oxide ($Al_2O_3$), hafnium oxide (HfO), or zirconium oxide (ZrO) may be deposited and formed as a part of the block insulating film 23. Subsequently, the insulating plate 13 is formed in the slit 51 by depositing silicon oxide. Subsequently, the plug 29 is formed on the silicon pillar 24, and the bit line 30 extending in the Y-direction is formed thereon. In this manner, the semiconductor memory device 1 according to the embodiment is manufactured.

Next, effects of the embodiment will be described.

As shown in FIGS. 1 and 2, in the semiconductor memory device 1 according to the embodiment, as the charge storage portion of the memory cell transistor MC, the conductive floating gate electrode 20 is provided. Therefore, the storage amount of electrons in each memory cell transistor is large, and the amount of change in threshold is large. As a result, the operational margin of the memory cell transistor MC is large.

Further, in the embodiment, in the process shown in FIGS. 10A and 10B, the floating gate electrode 20 is divided for each memory cell transistor MC. Therefore, electrons hardly move between the floating gate electrodes 20, and electrons can be stably stored in each floating gate electrode 20. As a result, the data holding characteristics of the memory cell transistor MC are excellent.

Further, in the embodiment, in the process shown in FIGS. 11A and 11B, the silicon nitride film 21 is recessed to expose the corner portion 20e of the floating gate electrode 20, and thereafter, in the process shown in FIGS. 12A and 12B, isotropic etching of the floating gate electrode 20 is performed. By doing this, the corner portion 20a facing the silicon pillar 24 in the floating gate electrode 20 is rounded. As a result, when a voltage is applied between the word line 19 and the silicon pillar 24, an electric field is prevented from concentrating on the corner portion 20a, and damage to the tunneling insulating film 28 can be suppressed. In particular, in an erasing operation, when electrons stored in the floating gate electrode 20 are extracted into the silicon pillar 24, an electron current can be prevented from concentrating on a portion covering the corner portion 20a of the tunneling insulating film 28. Therefore, even if a writing operation and an erasing operation in the memory cell transistor MC are repeated, the tunneling insulating film 28 is less deteriorated. Due to this, the semiconductor memory device 1 according to the embodiment has high reliability.

Comparative Example

Next, a comparative example will be described.

Figure 13:
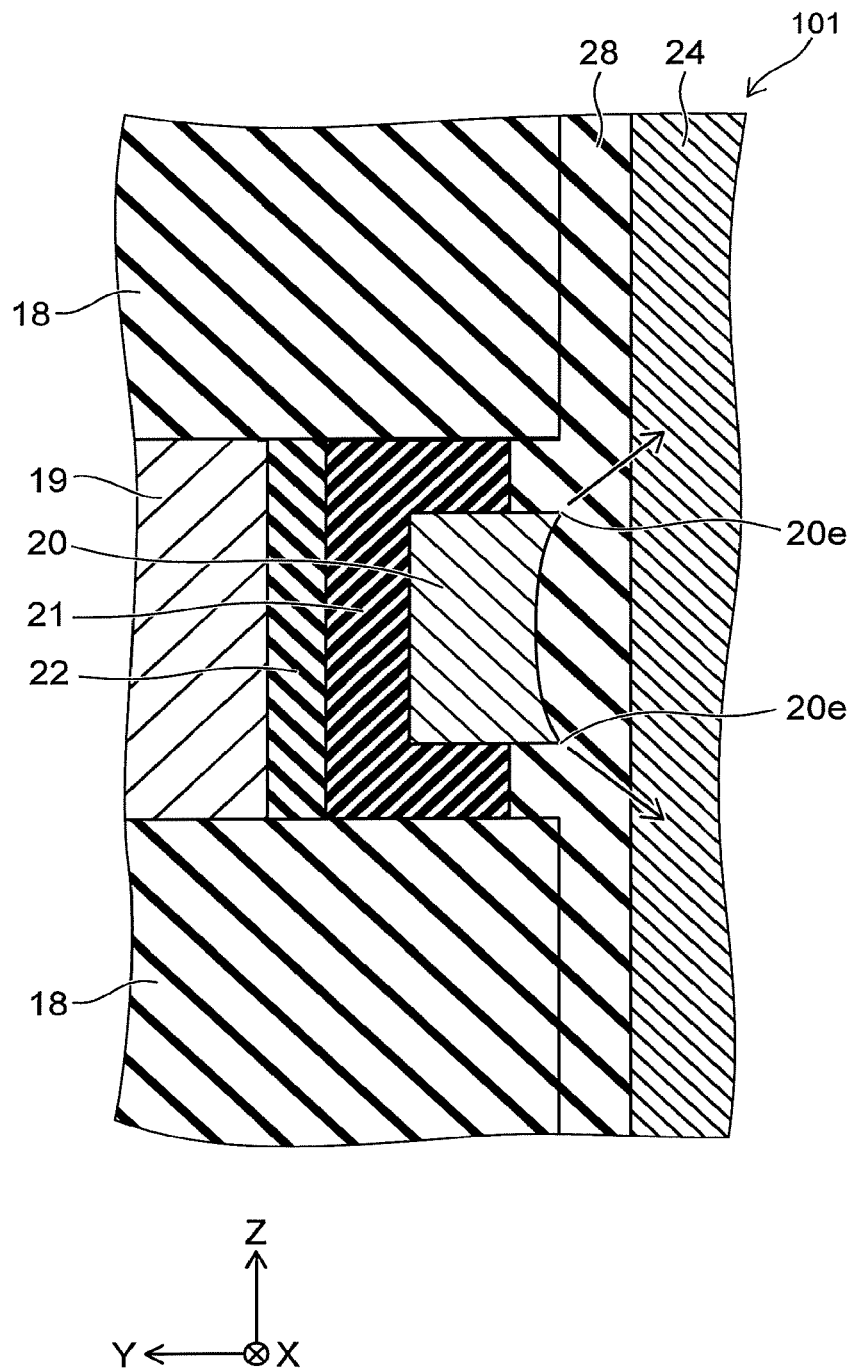
FIG. 13 is a sectional view showing one memory cell of a semiconductor memory device according to a comparative example.

FIG. 13 is a sectional view showing one memory cell of a semiconductor memory device according to the comparative example.

In the comparative example, the tunneling insulating film 28, the silicon pillar 24, and the like are formed without performing the process shown in FIGS. 12A and 12B after performing the processes shown in FIGS. 5A and 5B to FIGS. 11A and 11B.

Therefore, as shown in FIG. 13, in a semiconductor memory device 101 according to the comparative example, the corner portion 20e with an acute angle remains in the floating gate electrode 20. As a result, in particular, in an erasing operation, an electric field concentrates on the corner portion 20e, and a portion covering the corner portion 20e in the tunneling insulating film 28 is damaged, and the breakdown voltage may be decreased.

According to the embodiments described above, a semiconductor memory device having high reliability can be realized.

While certain embodiments of the invention have been described, these embodiments are presented only as an example and are not intended to limit the scope of the invention. The novel embodiments can be embodied in various other forms, and various omissions, substitutions, and changes can be made without departing from the spirit of the invention. The embodiments and modifications thereof are included in the scope and spirit of the invention and also included in the inventions described in the claims and in the scope of their equivalents.

What is claimed is:

1. A semiconductor memory device, comprising:
a substrate;
a first semiconductor member extending in a first direction perpendicular to a surface of the substrate;
a first interconnect extending in a second direction crossing the first direction, the second direction being parallel to the surface of the substrate; and
a first electrode disposed between the first semiconductor member and the first interconnect,
a curvature radius of a corner portion facing the first semiconductor member in the first electrode being larger than a curvature radius of a corner portion facing the first interconnect in the first electrode; and
further comprising:
a second interconnect extending in the second direction;
a second electrode disposed between the first semiconductor member and the second interconnect, the second electrode being adjacent to the first electrode in a third direction crossing the first direction and the second direction, the third direction being parallel to the surface of the substrate;
an insulating member provided between the first interconnect and the second interconnect, the insulating member extending in the first direction; and
a first insulating film provided between the first interconnect and the first electrode and between the first electrode and the insulating member,
the first semiconductor member being disposed between the first electrode and the second electrode in the third direction; and
further comprising a second semiconductor member next to the first semiconductor member in the second direction, the second semiconductor member extending in the first direction, wherein
the insulating member is provided between the first semiconductor member and the second semiconductor member.

2. The device according to claim 1, wherein
the first insulating film is provided on a surface facing the first direction in the first electrode,
a distance between the first semiconductor member and the first electrode is shorter than a distance between the first semiconductor member and the first insulating film.

3. The device according to claim 1, further comprising a second insulating film provided between the second interconnect and the second electrode and between the second electrode and the insulating member.

4. The device according to claim 1, further comprising a second insulating film provided between the first semiconductor member and the first electrode.

5. A semiconductor memory device, comprising:
a substrate;
a first semiconductor member extending in a first direction perpendicular to a surface of the substrate;
a first interconnect extending in a second direction crossing the first direction, the second direction being parallel to the surface of the substrate; and
a first electrode disposed between the first semiconductor member and the first interconnect, the first electrode includes a first surface facing the first semiconductor member, and a second surface crossing the first direction and the second direction, and extending in a third direction from the first interconnect to the first semiconductor member, the first surface including a first portion, the second surface including a second portion, and the first electrode being inclined away from the first semiconductor member toward the second portion from the first portion; and further comprising:

a second interconnect extending in the second direction;

a second electrode disposed between the first semiconductor member and the second interconnect;

an insulating member provided between the first interconnect and the second interconnect, the insulating member extending in the first direction; and a first insulating film provided between the first interconnect and the first electrode and between the first electrode and the insulating member, the first semiconductor member being disposed between the first electrode and the second electrode in the third direction, the third direction being parallel to the surface of the substrate; and further comprising a second semiconductor member next to the first semiconductor member in the second direction, the second semiconductor member extending in the first direction, wherein the insulating member is provided between the first semiconductor member and the second semiconductor member.

6. The device according to claim 5, wherein the first insulating film is provided on a surface facing the first direction in the first electrode, a distance between the first semiconductor member and the first electrode is shorter than a distance between the first semiconductor member and the first insulating film.

7. The device according to claim 5, further comprising a second insulating film provided between the first semiconductor member and the first electrode.

8. A semiconductor memory device, comprising:

a substrate;

a first semiconductor member extending in a first direction perpendicular to a surface of the substrate;

a first interconnect extending in a second direction crossing the first direction, the second direction being parallel to the surface of the substrate; and a first electrode disposed between the first semiconductor member and the first interconnect, wherein when a virtual point which moves on a surface of the first electrode moves from a central portion of a surface facing the first semiconductor member in the first electrode to a central portion of a surface facing the first direction in the first electrode through a corner portion facing the first semiconductor member in the first electrode in a shortest path, a moving direction of the point monotonously changes from the first direction to a third direction being perpendicular to a plane including the first direction and the second direction; and further comprising:

a second interconnect extending in the second direction;

a second electrode disposed between the first semiconductor member and the second interconnect, the second electrode being adjacent to the first electrode in the third direction crossing the first direction and the second direction, the third direction being parallel to the surface of the substrate;

an insulating member provided between the first interconnect and the second interconnect, the insulating member extending in the first direction; and a first insulating film provided between the first interconnect and the first electrode and between the first electrode and the insulating member, the first semiconductor member being disposed between the first electrode and the second electrode in the third direction; and further comprising a second semiconductor member next to the first semiconductor member in the second direction, the second semiconductor member extending in the first direction, wherein the insulating member is provided between the first semiconductor member and the second semiconductor member.

9. The device according to claim 8, wherein the first insulating film is provided on a surface facing the first direction in the first electrode, a distance between the first semiconductor member and the first electrode is shorter than a distance between the first semiconductor member and the first insulating film.

10. The device according to claim 8, further comprising a second insulating film provided between the second interconnect and the second electrode and between the second electrode and the insulating member.

11. A semiconductor memory device, comprising:

a substrate;

a first semiconductor member extending in a first direction perpendicular to a surface of the substrate;

a first interconnect extending in a second direction crossing the first direction, the second direction being parallel to the surface of the substrate; and a first electrode disposed between the first semiconductor member and the first interconnect, a surface facing the first semiconductor member in the first electrode being curved in a convex shape; and further comprising:

a second interconnect extending in the second direction;

a second electrode disposed between the first semiconductor member and the second interconnect, the second electrode being adjacent to the first electrode in a third direction crossing the first direction and the second direction, the third direction being parallel to the surface of the substrate;

an insulating member provided between the first interconnect and the second interconnect, the insulating member extending in the first direction; and a first insulating film provided between the first interconnect and the first electrode and between the first electrode and the insulating member, the first semiconductor member being disposed between the first electrode and the second electrode in the third direction; and further comprising a second semiconductor member next to the first semiconductor member in the second direction, the second semiconductor member extending in the first direction, wherein the insulating member is provided between the first semiconductor member and the second semiconductor member.

12. The device according to claim 11, wherein the first insulating film is provided on a surface facing the first direction in the first electrode, a distance between the first semiconductor member and the first electrode is shorter than a distance between the first semiconductor member and the first insulating film.

13. The device according to claim 11, further comprising a first insulating film provided on a surface facing the first direction in the first electrode and between the first electrode and the first interconnect,
- the first insulating film including a first surface facing the first semiconductor member,
- the first electrode including a second surface facing the first semiconductor member, and
- the second surface protruding on a side of the first semiconductor member more than the first surface.

\* \* \* \* \*